United States Patent [19]

Kornfeld

[11] Patent Number: 4,736,442
[45] Date of Patent: Apr. 5, 1988

[54] SYSTEM AND METHOD FOR ORTHOGONAL IMAGE TRANSFORMATION

[76] Inventor: Cary D. Kornfeld, 232 Mountain Ave., Murray Hill, N.J. 07974

[21] Appl. No.: 737,815

[22] Filed: May 23, 1985

[51] Int. Cl.⁴ .............................................. G06K 9/36
[52] U.S. Cl. .................................... 382/44; 340/723; 340/727; 382/46
[58] Field of Search ............... 382/46, 48, 44; 358/22; 340/727, 731, 723; 364/518, 521

[56] References Cited

U.S. PATENT DOCUMENTS

| | | | |
|---|---|---|---|
| 3,811,110 | 5/1974 | Inose et al. | 382/46 |
| 4,052,699 | 10/1977 | Micka et al. | 340/146.3 MA |
| 4,545,069 | 10/1985 | Kermisch | 382/46 |
| 4,593,407 | 6/1986 | Konishi et al. | 382/46 |
| 4,636,783 | 1/1987 | Omachi | 382/46 |

OTHER PUBLICATIONS

*IBM Technical Disclosure Bulletin*, vol. 18, No. 8, pp. 2633–2639, "Shift Register System for Image Orientation", by D. E. Gold et al.

*Primary Examiner*—Leo H. Boudreau

[57] ABSTRACT

A system using a special memory matrix termed an "image prism". The image prism is row and column accessible and is connected to input and output of a conventional bitmap memory. Row select lines pass horizontally through the matrix, column select lines pass vertically through the matrix, data lines run perpendicular to select lines. Row and column data lines are tied together at nodes on a diagonal of the matrix. Data-in lines and data-out lines comprise two sets of data lines. Data words enter the image prism with bits in parallel along the row data-in lines. Data words exit the image prism along the column data-out lines. Data may be written into or out of the image prism by either row or column and either forward or backward. Image data is transformed by transforming image prism size tiles of data using the image prism, and moving them to their final destination in bitmap memory.

15 Claims, 6 Drawing Sheets

SYSTEM AND METHOD FOR ORTHOGONAL IMAGE TRANSFORMATION

TECHNICAL FIELD

The present invention relates to image processing systems and in particular to a system and method for performing mirror and rotate operations on image data.

BACKGROUND ART

Orthogonal transformations, i.e. mirror and rotate operations, are frequently omitted from bitmap graphics systems, because they are computationally intensive, require a large number of memory references and considerable bit shifting. These difficulties are primarily due to the frame buffer organization in bitmap graphics systems. The frame buffer is used for refreshing raster scan display devices in addition to image data storage, so it is usually organized in raster scan order. Typically, Pixel vectors can only be accessed by row, not by column, and only at word boundaries. Thus, all of the usual image transformations except the identity transformation, which requires no bitmap word moves, and the mirror transformation along the x-axis, which only requires exchanging words on corresponding rows, are difficult to perform.

Several ways to rotate an image have been developed. In one rotation, using an image shearing algorithm, a sequence of shearing operations are made. Each shear operation operates on each column or row of a matrix by progressively large amounts. To perform a 90 degree counterclockwise rotation, for example, three shear operations, shear horizontally right from top, shear vertically down from right, and shear horizontally left from bottom, are used.

Using a recursive permutation algorithm for rotation, progressively larger pieces of the image are permuted or rotated. The first step is to divide the image into groups of two by two pixel matrices. Each matrix is permuted. To perform a 90 degree counterclockwise rotation, for example, the upper right pixel of each matrix moves to the upper left position, each upper left pixel moves to the lower left position of the matrix, the lower left pixels move to the lower right positions, and the lower right pixel of each matrix moves to the upper right position. The second step treats each two by two permuted matrix as a unit and divides the matrix into four by four pixel matrices, i.e., four two by two units. Each of these four by four matrices is permuted. The top right two by two unit is moved left, and so forth. The next step uses the four by four matrices as units. The sequence is repeated until the entire matrix is rotated.

In U.S. Pat. No. 4,052,699 to Micka et al, an image processing system rotates an image 90 degrees clockwise by first sequentially loading image data in parallel by row into an n by n matrix, where each word is n bits long. The matrix is then unloaded sequentially in parallel by column into an array of n word length shift registers. The result is n vertical words each composed of n bits from a given bit position in each register. Output words are then stored in an external image memory for subsequent accessibility.

The primary advantage of the first two algorithms is that they both transform the image in situ so that temporary storage is not required. However, the organization of bitmap memory makes their implementation difficult. The shearing algorithm requires several memory operations per pixel. The vertical shear used in the image shearing rotation algorithm is awkward, because it requires accessing and shifting columns of vectors. The first step, involving two by two matrices, in the recursive permutation algorithm requires approximately one memory operation per pixel. Each subsequent step accesses each pixel at least once. So, the recursive permutation algorithm requires log n memory operations per pixel, where n is the number of pixels along the longest edge of the image being rotated.

Accordingly, it is an object of the invention to produce a system for performing orthogonal transformations which is fast and easy to implement with conventional bitmap memories.

It is another object of the invention to produce a method in which orthogonal transformations are performed directly without large amounts of extra memory, permuting progressively larger pieces of image, shifting or shearing.

DISCLOSURE OF THE INVENTION

The above objects have been met by performing orthogonal image transformations on a conventional bitmap memory using a device termed an "image prism". In this invention an image prism is a special memory matrix connected to the bitmap memory which is capable of implementing six of eight orthogonal transformations, operating sequentially on small blocks of an image. The image prism is able to do these transformations because it is accessible by both rows and columns and its performance is augmented by the particular way in which the data lines are connected.

Words of data from the bitmap memory are transferred into the image prism either by row from top to bottom or bottom to top or by column from left to right or right to left. Data is transferred out of the image prism in the same way by row or column and in forward or reverse direction. Different combinations of data transfers to and from the image prism transform the image blocks in six of the eight ways.

The image prism memory cells are preferably laid out so that control signals flow perpendicular to data lines. A vector of cells is selected via a common bus line which runs through each. A plurality of row select bus lines pass horizontally through the matrix and a plurality of column select bus lines pass vertically through the matrix. The image prism may have separate sets of input and output lines that run parallel to each other or may share a common data line for both input and output. Row data lines flow vertically through the matrix, each line running through a pixel cell in each row. Column data lines run horizontally through the matrix.

The operation of the image prism is enhanced by the way data lines are tied together. Row and column data-in lines are tied together along a diagonal of the matrix. Data-out lines are tied together in an identical fashion. Either the major or minor diagonal may be used for the points. For example, the ith vertical row data line connects with the ith horizontal column data line at the major diagonal of the matrix or connects with the (n-i)th horizontal column data line at the minor diagonal of the matrix. If the minor diagonal is chosen, six of the transformations, with the exception of identity and mirror along the x-axis, may be obtained.

The image prism is used in a method that transforms small blocks or tiles of the image and moves the transformed tiles directly to their final destination on the bitmap. For an orthogonal transformation, the tiles naturally form groups of one, two or four members each, each member of a group having a final destination at a location of another member of the group. So, the first task is to identify members of a group. To transform an image, the image is first divided into tiles the size of the image prism. A group of untransformed tiles is determined by selecting an untransformed tile, determining its destination to find the next group member, determining that tile's destination, and so forth until the destination returns to a tile that is already a member of the group. Once a group is determined, each member is transformed by the image prism and moved to its final destination.

When one group is completely transformed and moved, another group is selected, transformed and moved until all tiles have been transformed. A temporary storage site saves a block or tile of image data from a group during transfer of another group tile to that location. The temporary storage site may be conventional memory that is row accessible only or may be another image prism. Control circuitry, such as bitmap address counters and image prism vector counters, are used to direct the flow of data between bitmap memory, the image prism, and temporary storage.

Using image prisms, image orthogonal transformations are fast, easy and require only a small amount of additional hardware.

BEST MODE OF CARRYING OUT THE INVENTION

Figure 1:
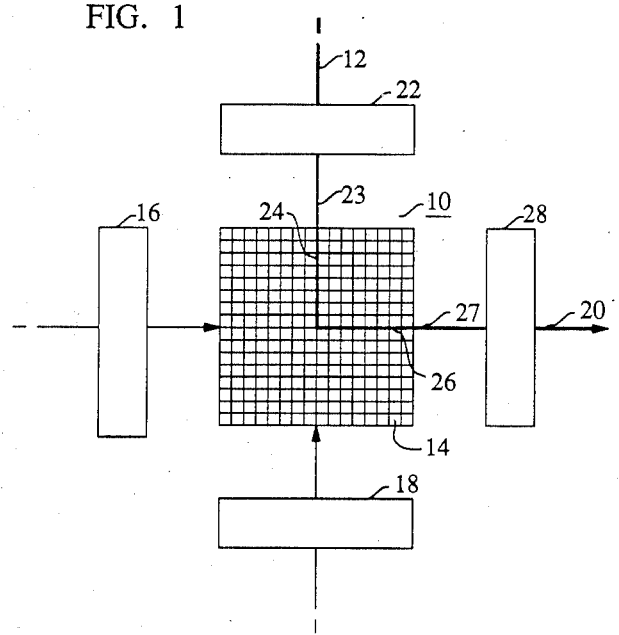
FIG. 1 is a diagram showing block organization of an image prism of the present invention.

With reference to FIG. 1, an image prism 10, comprising a square array of memory cells, receives image data along line 12 from a bitmap memory, not shown. Image prism 10 is a row and column accessible memory matrix measuring N by N pixel cells 14, where N is the width of a memory word. A typical image prism measures 16 by 16 pixel cells, and may be part of a bitmap memory chip or may be a special chip. A row select driver 16 and a column select driver 18 generate a signal along a select bus line, discussed in connection with FIG. 2, to latch incoming data along line 12 into or read outgoing data along line 20 out of each cell in the row or column selected.

The image prism has a N-bit wide data path and typically has a separate input buffer 22 and an output driver 28. Data words 12 from the bitmap memory enter the image prism 10 in parallel through a data bus 23, flowing parallel to columns in a vertical direction along row data bus 24 into the matrix. Data words exit image prism 10 in parallel through a data bus 27 to output driver 28, to output line 20, flowing out of the matrix parallel to rows in a horizontal direction along column data bus 26, then return to the bitmap memory.

Memory cells 14 are laid out so that control signals flow perpendicular to data lines. For example, in FIG. 2, a row 30 of pixel memory cells is selected via a common row select bus line 32, which runs through each cell. Data are latched into each cell from row data lines 34 which run perpendicular to row 30. Row data line d15, for example, latches data into cell 36. Row data line d15 also sends data to the right-most cell in other rows, but the data are not latched into these cells until those rows are selected by their particular row select line. Data are read out of each cell in row 30 from a second set of row data lines, not shown. These data-out lines run parallel to data-in lines 34. Alternatively, data may be read out using the same bus lines 34 as are used for reading in data, as might be used in a tristate version of the device. Row 30 is selected for data output by the same row select line 32 as for data input. Columns of cells read and write data in the same way as rows except that column select lines run vertically through each cell and column data lines run horizontally perpendicular to each column.

Figure 3:
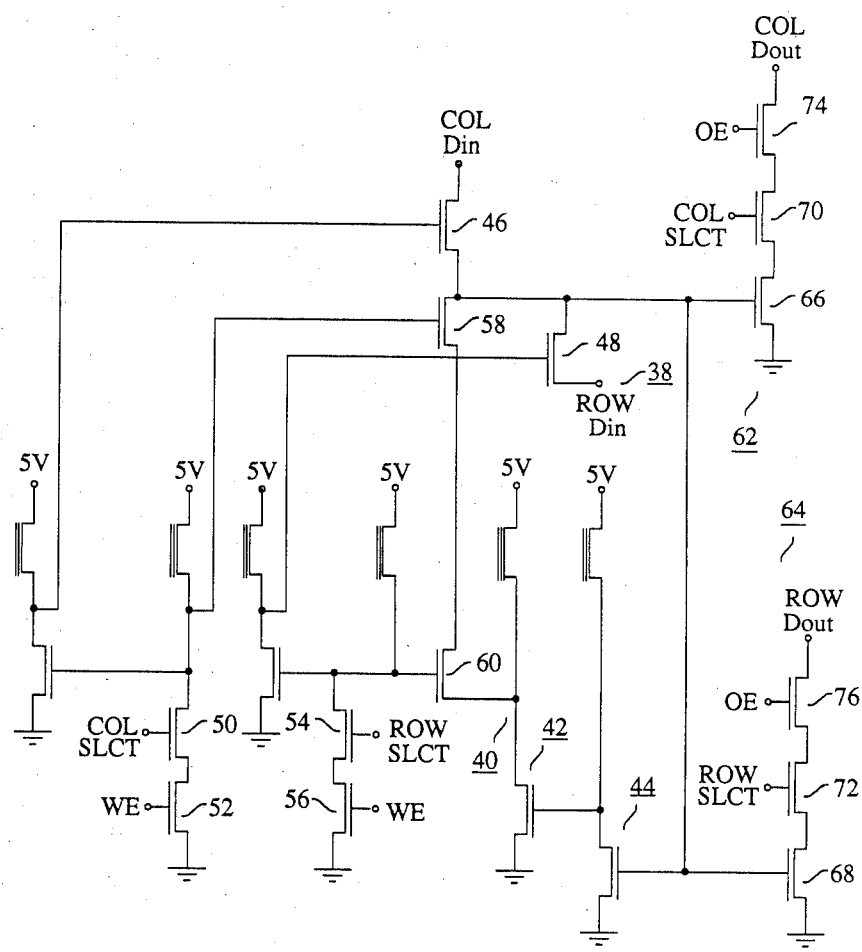
FIG. 3 is a schematic diagram of a row and column addressable circuit in an image prism of the present invention.

Memory cells 14 in the image prism 10 of FIG. 1 must be able to read and write by both row and column. In FIG. 3, a circuit 38 for a row and column addressable memory cell is illustrated by way of example. Many other such circuits are possible. Circuit 38 has a one bit static memory cell 40 comprising a pair of inverters 42 and 44 connected so the output of each is connected to the input of the other. Memory cells of more than one bit may also be used in order to provide gray levels or color to image pixels corresponding to these memory cells.

Data from column or row data-in lines are latched into a selected column or row of memory cells, such as cell 40, through one of a pair of transistor gates 46 and 48. A column select transistor 50 and write enable transistor 52 control gate 46 to allow column data input when both transistors 50 and 52 are on. A row select transistor 54 and write enable transistor 56 control gate 48 to allow row data input when both transistors 54 and 56 are on. Feedback control latches 58 and 60 in memory cell 40 are normally on to maintain inverters 42 and 44 in their present state. One of the latches 58 and 60 is shut off by transistors 50 and 52 or by transistors 54 and 56 when data is written into cell 40.

Data currently in cell 40 may be output to column or row data-out lines by column and row output elements 62 and 64. Each output element is made by connecting transistor 66 or 68 to memory cell 40, a column select transistor 70 or row select transistor 72 and an output enable transistor 74 or 76. Data is output to the bus lines when the cell column or row is selected, COL SLCT or ROW SLCT on, and the output enable signal OE is on.

Four independent sets of data lines, data-in and data-out for both columns and rows, could be used for data transfer. Data would enter the image prism 10 along either row or column data-in lines and would exit along either row or column data-out lines, depending on whether rows or columns are selected. However, this is both unnecessary and redundant, because the row and column data-in lines input a pixel vector to only one set of selected cells, either a set of row cells or a set of column cells, at a time. Similarly, data-out lines output a pixel vector from only one set of selected cells at a time. Only two independent sets of data lines, data-in and data-out, are used. Column and row data lines are tied together to form a data line network. Within each network of bus lines, data flows both vertically and horizontally. Alternatively, data lines can be further combined so that data is both read into and out of the same bus lines.

Figure 4A:
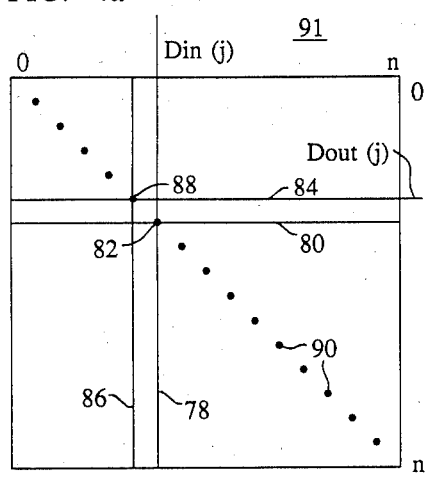
FIGS. 4a and 4b are diagrams showing interconnection of row and column bus lines of an image prism of the present invention.

The manner in which data lines are tied together is important. In FIG. 4A, row data-in line 78 and column data-in line 80 are connected at a node 82. Row data-out line 86 and column data-out line 84 are connected at node 88. Other nodes 90, indicated by dots, connect other row and column data lines. Nodes 82, 88 and 90 all lie along the major diagonal of image prism 91. This interconnection of row and column data lines causes the jth bit of each row to be tied to the jth bit of each column.

Figure 4B:
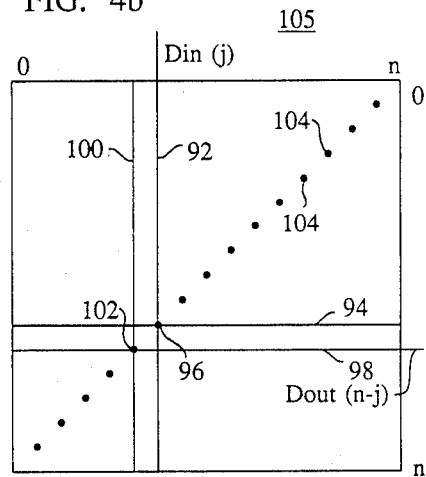

In FIG. 4b, row data-in line 92 and column data-in line 94 are connected at a node 96. Row data-out line 100 and column data-out line 98 are connected at a node 102. Other nodes 104, indicated by dots, connect other row and column data lines. Nodes 96, 102 and 104 all lie along the minor diagonal of image prism 105. In this case the interconnection of row and column lines causes the jth bit of each row to be tied to the (n-j)th bit of each column.

Data bits are reversed if data is made to enter image prism 105 vertically and exit horizontally. Data words enter image prism 105 with bit DIN(j) flowing in parallel along row data-in line 92. Data placed into image prism 105 by rows, either from top to bottom, designated R+, or from bottom to top, designated R−, goes directly to the row of cells selected by a row select bus line. Data placed into image prism 105 by columns, either from left to right, designated C+, or from right to left, designated C−, flows down the row data-in lines to the nodes, and along the column data-in lines to the column of cells selected by a column select bus line. The order of the bits is reversed at the nodes.

Data words leave image prism 105 with bit DOUT(n-j) flowing in parallel along column data-out line 98. Data taken out of image prism 105 by columns, either from left to right, C+ or from right to left, C−, goes directly from the column of cells selected by a column select bus line, along column data-out lines 98 and out of image prism 105. Data words taken out of image prism 105 by row, either from top to bottom, R+ or from bottom to top, R−, flow down the row data-out lines to the nodes and out along the column data-out lines. The order of the bits is reversed at the nodes.

Figure 5:
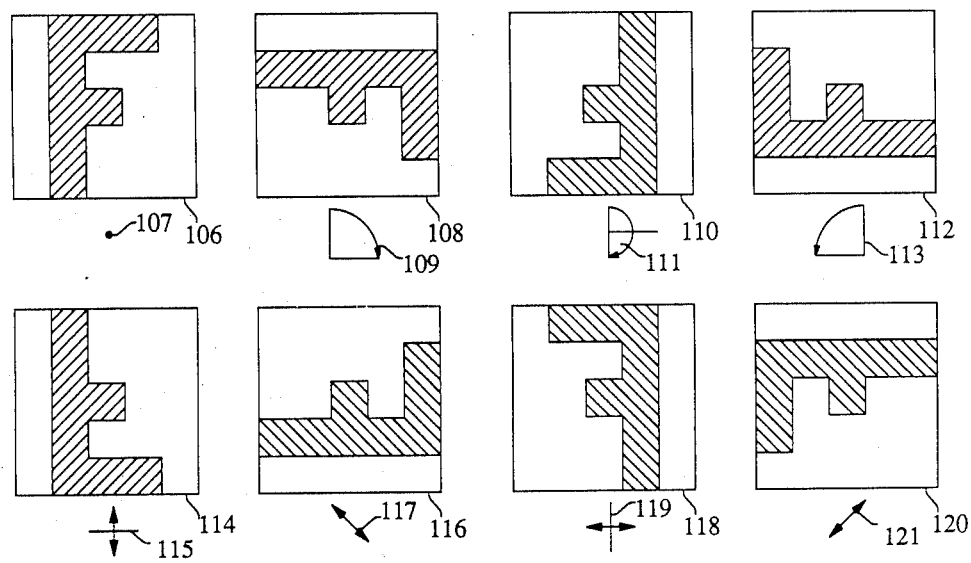
FIG. 5 is a diagram showing the orthogonal transformations.

The orthogonal image group consists of a set of eight orthogonally related images and a set of orthogonal transformations which convert any one of these images into any other. This set of images corresponds to the eight ways a slide can be loaded into a slide projector. In FIG. 5, the group representation for an image of the letter F is shown. The name given to each image refers to the transformation which converts the identity image 106 into that image. The set of images and corresponding transformations are identity 106, clockwise rotation by 90 degrees 108, rotation by 180 degrees 110, counterclockwise rotation by 90 degrees 112, mirror along the x-axis 114, mirror along the minor axis 116, mirror along the y-axis 118, and mirror along the major axis 120. A symbol below each transformation is a shorthand representation of that transformation, used below in the discussion of FIGS. 6a–6d. Symbol 107 represents the identity transformation corresponding to image 106. Symbol 109 represents clockwise rotation by 90 degrees, symbol 111 represents rotation by 180 degrees, symbol 113 represents counterclockwise rotation by 90 degrees, symbol 115 represents mirroring along the x-axis, symbol 117 represents mirroring along the minor diagonal axis, symbol 119 represents mirroring along the y-axis, and symbol 121 represents mirroring along the major diagonal axis.

Image prism 10 performs these orthogonal transformations by reading in words from the bitmap memory, then transferring them back to bitmap memory. There are four ways to map bitmap images into the image prism. Each mapping results in the creation of a different image inside the image prism. Reading out rows of bitmap memory, from top to bottom rows, may be mapped to the image prism by rows from top to bottom designated by R+, by rows from bottom to top, designated by R−, by columns from left to right, designated by C+, or by columns from right to left, designated by C−. For example, if image prism 91 in FIG. 4A is used and rows are mapped to columns from right to left, i.e. C− is used, then the resulting transformation is a clockwise 90 degree rotation.

An image in the image prism may also be transferred back to bitmap memory, from top to bottom rows, in four ways. The image prism may map to rows of bitmap memory by rows from top to bottom, R+, rows from bottom to top, R−, columns from left to right C+, or from columns from right to left, C−. For example, if image prism 91 in FIG. 4a is used and rows of the image prism are taken from bottom to top and mapped into rows of memory, i.e. R− is used, then the resulting transformation is a mirroring along the x-axis.

Figure 6A:
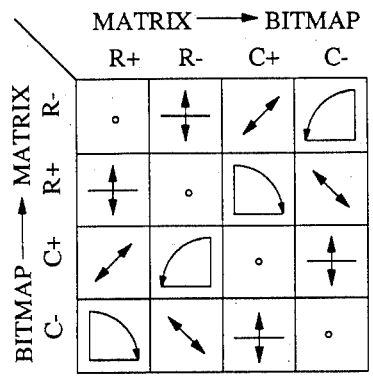
FIGS. 6a–d are matrix diagrams showing the combinations of transformations available to image prisms of the present invention.

There are sixteen different mappings which can be made when passing an image through an image prism—four ways to map it into the prism and another four ways to transfer it back to bitmap memory. FIG. 6A enumerates each of these sixteen ways for image prism 91 in FIG. 4a, using the shorthand representations of the transformations of FIG. 5. For example, if rows of memory are first mapped to columns of the image prism from right to left, C−, then taken out of the image prism by rows from bottom to top, R− and placed back into rows of memory, the image has undergone a mirroring along the minor diagonal axis 122.

Figure 6B:
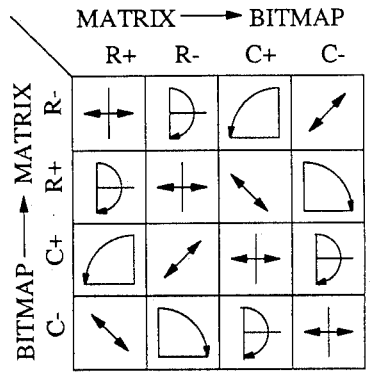
Figure 6C:
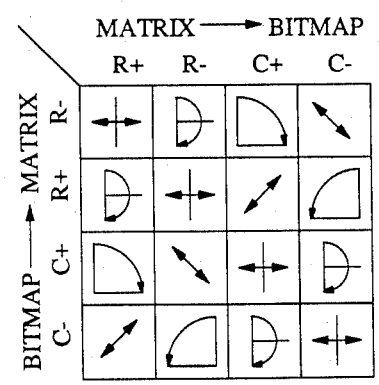

With reference to FIGS. 6b and 6c, image prism 91 in FIG. 4a is used except that the bits of each word are reversed in order, i.e. ith bit and (n-i)th bit are switched. In FIG. 6b, the sixteen different mappings are illustrated in which words are taken from bitmap memory and reversed before entry into the image prism. Reversal may be done by connecting the bus lines from the bitmap memory to the image prism's data in bus connector 22 in FIG. 1, backwards. The reversed words are then placed into the image prism by row from top to bottom, R+, by row from bottom to top, R−, by column from left to right, C+, or by column from right to left, C−. The image in the image prism is then taken out of the image prism without reversal, i.e. the same way as in FIG. 6a.

In FIG. 6c, words are transferred from bitmap memory to the image prism without reversal but reversed upon exit from the image prism. This reversal may be accomplished, for example, by connecting the bus lines to the bitmap memory from the image prism's data-out bus connector 28 in FIG. 1, backwards. The image in the image prism is taken out by row from top to bottom, R+, by row from bottom to top, R—, by column from left to right, C+, or by column from right to left, C—. The bits of resulting words are then reversed in order and the reversed words placed back into bitmap memory. Again these are sixteen different mappings, as shown in FIG. 6c.

Figure 6D:
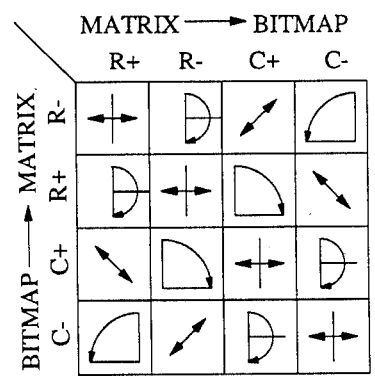

With reference to FIG. 6d, image prism 105 in FIG. 4b has row to column bus connections along the minor diagonal of the image prism. As noted above, the interconnection of row and column data lines along the minor diagonal causes the jth bit of each row to be tied to the (n-j)th bit of each column. Reverse ordering of word bits occurs automatically inside the image prism when data enters vertically and exits horizontally. This is the preferred embodiment.

The set of sixteen mappings is shown. For example, if bitmap memory is mapped to the image prism using R+ and then mapped back to bitmap memory using R+, the resulting transformation is mirroring along the y-axis 124.

The set of mappings in each case includes six of the eight possible transformations. In FIG. 6A, for image prisms with major diagonal nodes and no reversal, the transformations are identity, mirror along the x-axis, mirror along the major diagonal, mirror along the minor diagonal, clockwise 90 degree rotation, and counterclockwise 90 degree rotation. Mirror along the y-axis and 180 degree rotation cannot be done with one pass through the image prism. The transformation mirror along the y-axis can be done, for example, by first mirroring along the major diagonal and then rotating clockwise 90 degrees. The transformation 180 degree rotation can be done, for example, by performing two clockwise 90 degree rotations. Each of these transformations require two passes through the image prism.

In FIGS. 6b–6d, for image prisms having reversal of bit order in words, all transformations are included but identity and mirror along the x-axis. Again, these two transformations can be done with two passes through the image prism. For example, mirror along the x-axis can be done by first mirroring along the y-axis, then rotating 180 degrees. Two mirrorings along the y-axis will give the identity transformation. However, the identity transformation does not require any operation at all. Further, the mirror along the x-axis transformation can be performed efficiently without any special hardware by merely exchanging corresponding rows in bitmap memory.

Although any particular mapping may give a different transformation, each of the three sets of transformations in FIGS. 6b–6d, i.e. reversal of word bit order upon entry to the image prism, reversal upon exit from the image prism or internal reversal due to minor diagonal nodes in the image prism has the same set of possible transformations. These three cases are preferred over the case for FIG. 6a. Of these preferred cases, the image prism with minor diagonal nodes is slightly preferred over the others, because the bus lines between bitmap memory and image prism need not be connected in reverse and because data can be reversed twice within the prism.

Figure 7:
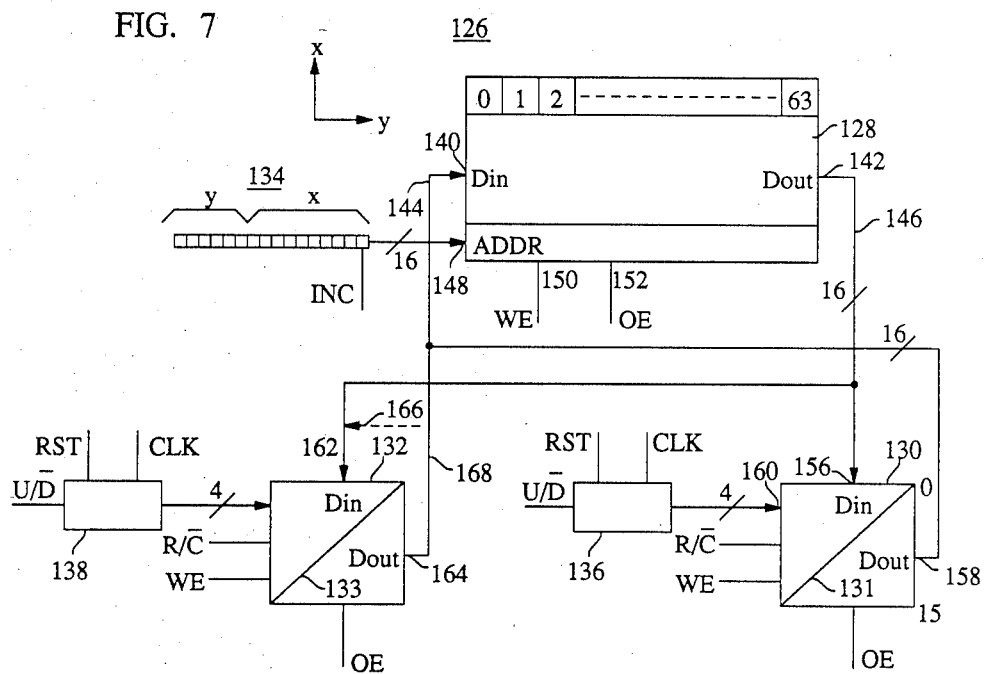
FIG. 7 is a schematic diagram of the system of the present invention.

With reference to FIG. 7, a circuit 126 for performing orthogonal image transformations has a bitmap memory 128, an image prism 130, a temporary storage memory 132, and counters 134, 136 and 138 for controlling data flow. Bitmap memory 128 is typically conventional bitmap memory being raster ordered, and being accessible only by row and only at discrete word boundaries. Bitmap memory 128 has a data input port 140 and a data output port 142 that connect to data bus lines 144 and 146 respectively. Typically, data ports 140 and 142 are parallel ports of word width. Bitmap memory 128 also has connections 148, 150 and 152 for receiving an address signal ADDR, a write enable signal WE and an output enable signal OE, respectively for controlling data flow into and out of bitmap memory 128.

The bitmap memory 128 shown on FIG. 7, has 64K words, each word being 16 bits wide. Words are addressed by row x from 0 to 1023, and by word y within a row from 0 to 63. Other size memories and addressing schemes may also be used. In the present case, 16 bits are needed to specify an address, and 16 bit wide parallel ports 140 and 142 are needed to transfer data words into and out of bitmap memory 138.

An address is specified in the present application by counter 134 connected to bitmap memory 128 at 148. Counter 134 is typically a 16 bit address register for 64K word memory 128 with the first six bits designating the word y within a row and the second ten bits designating the row x. Counter 134 has a connection 154 for receiving an increment signal INC that increases the address by one.

Image prism 130 is a row and column accessible memory matrix measuring n×n cells, where n is the word width. Image prism 130 is typically 16×16 cells, although other dimensions may also be used. Image prism 130 is substantially the same as those described with reference to FIGS. 1–6, having pluralities of column and row data-in and data-out bus lines, with row and column bus lines being connected at nodes along a diagonal 131 of the matrix. Node connection along the minor diagonal as described in FIGS. 4b and 6d, is preferred. Alternatively, image prism 130 may have nodes along its major diagonal.

Image prism 130 has a data input port 156 and a data output port 158 that connect to data bus lines 146 and 144 respectively. Data ports 156 and 158 are parallel ports of word width, being typically 16 bits wide. Data bus line 146 transfers data words from the output port 142 of bitmap memory 128 to input port 156. Bus line 146 may be connected so that the ith bit of a word from bitmap memory 128 at port 142 corresponds to the ith bit of a word entering image prism 130 at port 156, or it may be connected backwards so that the ith bit of a word at port 142 corresponds to the (n-i)th bit of a word at port 156, where n is the word width. If bus line 146 is connected backwards, bit order for words is reversed upon entry into image prism 130. Likewise, bus line 144 transfers data words from the output port 158 of image prism 130 to input port 140 of bitmap memory 128. Bus line 144 may also be connected forwards or backwards.

Figure 2:
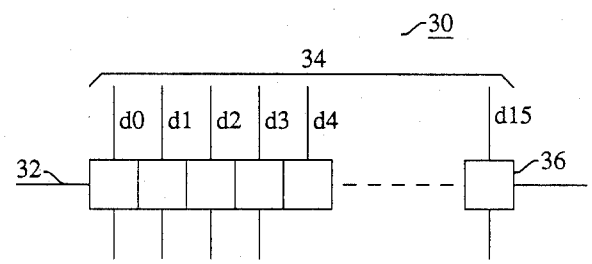
FIG. 2 is a detail of FIG. 1 showing bus line organization in a row of image prism memory.

Image prism 130 has a plurality of row and column select lines, as described with reference to FIGS. 1 and 2. These select lines are controlled by a counter 136 connected to image prism 130 are 160. Counter 136 is typically a 4-bit counter for 16 bit words, and designates the row or column that is selected. Counter 136 receives a reset signal RST for setting itself to zero, a clock signal CLK for incrementing the selected row or column by one, and a direction signal U/D for determining whether to increment up or down. Image prism 130 also receives a row or column signal R/C for activating the appropriate select lines, a write enable signal WE for writing of data into the image prism, and an output enable signal OE for transferring data to data-out lines.

System 126 also has a temporary storage memory 132. Temporary storage memory 132 is typically an n by n cell matrix, where n is the word width, and may be either a conventional row only accessible memory or preferably another image prism like image prism 130. Temporary storage memory 132 may also be part of bitmap memory 128. When temporary storage memory 132 is an image prism, it is substantially the same as those described with reference to FIGS. 1–6, having pluralities of column and row data-in and data-out lines, with row and column bus lines being connected at nodes along a diagonal 133 of the matrix. Node connection along the minor diagonal, as described in FIGS. 4b and 6d, is preferred. Alternatively, image prism 132 may have nodes along its major diagonal. Temporary storage memory 132 has a port 162 for receiving data input DIN from bus line 146. Temporary storage memory 132 also has an output port 164. If storage memory 132 is another image prism, then data output DOUT is tranferred from port 164 to bitmap memory 128 via bus lines 168 and 144. If storage memory 132 is conventional memory then data output DOUT is transferred from port 164 to the input port of image prism 130 by bus lines 166 and 146.

Temporary storage memory 132 has a counter 138 and receives control signals like those of image prism 130. If storage memory 132 is another image prism, then counter 138 is identical to counter 136 and storage memory 132 receives the same type of control signals R/C̄, U/D̄, WE and OE as image prism 130. If storage memory 132 is conventional row only accessible memory, then counter 138 is like counter 136 except that it does not receive a direction signal U/D̄. Similarly, conventional storage memory 132 does not receive a row or column signal R/C̄.

Figure 8:
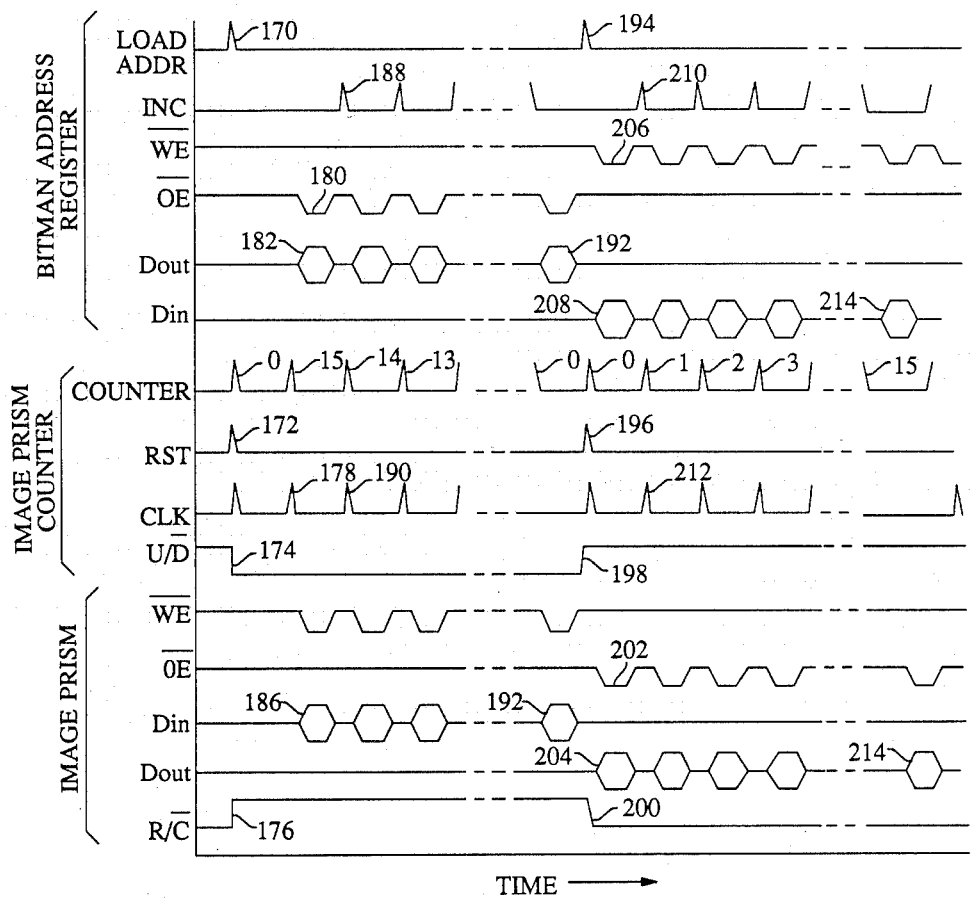
FIG. 8 is a timing diagram for the system of FIG. 7.

With reference to FIGS. 7 and 8, control signals control transfer of a block of image data from bitmap memory to image prism and back to bitmap memory. In the present example, data is put into the image prism 130 by rows from bottom to top and then taken out by columns from left to right. If the image prism 105 of FIGS. 4b and 6d is used then the resulting transformation is a clockwise rotation by 90 degrees. If temporary storage memory 132 is an image prism, data is put in and taken out image prism 132 in the same way.

In order to put data into the image prism 130 by rows from bottom to top, a load address signal 170 is sent to counter 134. An address, designating the first word of bitmap memory 128 to be transferred to image prism 130, is loaded into counter 134. Reset pulse, RST, 172, resets the image prism counter 136 to zero. Direction signal, U/D̄, 174, drops low to set counter 136 to decrement. Row or column signal, R/C̄, 176, goes high to set image prism 130 to select by rows. After the next clock pulse, 178, the image prism counter 136 will designate row 15 of image prism 130 for data input.

Bitmap memory 128 receives an output enable signal, OE, 180, which then outputs a data word, DOUT, 182, from the address designated by counter 134 onto bus line 146. Image prism 130 receives a write enable signal, WE, 184, which inputs data word, DIN, 186, into row 15 of image prism 130 from bus line 146. Data word, DOUT, 182, output from bitmap memory 128, is the same as data word DIN, 186, input into image prism 130. Each data word is transferred from bitmap 128 to image prism 130 as a multibit signal with bits in parallel.

Each bit of the data word may be either high or low, as indicated by the shape of words 182 and 186 in FIG. 8. After data is transferred from bitmap memory 128 to image prism 130, an increment signal, INC, 188, increments the address in counter 134. A clock pulse, CLK, 190, decrements counter 136. Image prism counter 136 now designates row 14 for data input.

This process of transferring data to rows of image prism 130, incrementing counter 134 and decrementing counter 136 continues until data word, 192, has been transferred into row O of image prism 130. At this point, an entire block of image data has been put into image prism 130 by row from bottom to top.

In order to take data out of image prism 130 by columns from left to right and load it into its destination in bitmap memory 128, a load address signal 194 is sent to counter 134. An address, designating the destination in bitmap memory 128 of the first word to be transferred, is loaded into counter 134. A reset pulse, RST, 196, resets the image prism counter 136 to zero. A direction signal, U/D̄, 198, goes high to set counter 136 to increment. Row or column signal, R/C̄, 200, drops low to set image prism 130 to select by columns. Image prism counter 136 thus designates column 0 of image prism 130 for data output.

Image prism 130 receives an output enable signal, OE, 202 which outputs a data word, DOUT, 204, from column 0 of image prism 130, onto bus line 144. Bitmap memory 128 receives a write enable signal WE, 206, which then writes data word, DIN, 208, on bus line 144 into the address of bitmap memory 128 designated by counter 134. Data word, DOUT, 204, output from image prism 130, is the same as data word, DIN, 208, written into bitmap memory 128. Each data word is transferred from image prism 130 to bitmap memory 128 as a multibit signal with bits in parallel. Each bit of a data word may be either high or low, as indicated by the shape of words 202 and 208 in FIG. 8. After data is transferred from image prism 130 to bitmap memory 128, an increment signal, INC, 210, increments the address in counter 134. A clock pulse, CLK, 212, increments image prism counter 136. Image prism counter 136 now designates column 1 for data output.

This process of transferring data from columns of image prism 130, incrementing counter 134, and incrementing column 136 continues until data word, 214, has been transferred from column 15 of image prism 130 to bitmap memory 128. At this point, an entire block of image data has been transformed and relocated.

Figure 9:
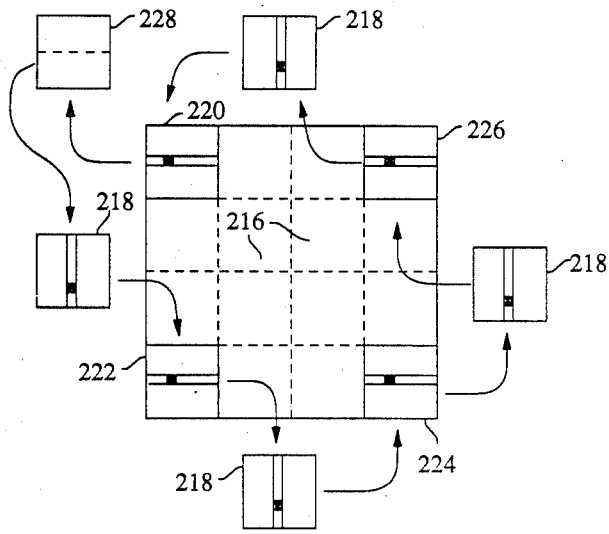
FIG. 9 is a plan illustrating movement of tiles in the method of the present invention.

With reference to FIG. 9, images larger than an image prism may be transformed by a method in which an image is first divided into tiles 216, each of which is the size of an image prism 218. The number, size and arrangement of tiles is related to the size of the bitmap memory and the image therein. The tiles are of identical size and adjacent to each other, forming a mosaic of the bitmap image. This mosaic is decomposed so that tiles may be manipulated individually. Each tile 216 is individually transformed and moved one at a time using image prism 128 to obtain the final transformed image.

Tiles 216 are associated with other tiles as members of a number of groups. Each group has as members the smallest number of tiles whose destination is the location of another member of the group. For example, tiles 220, 222, 224 and 226 form a group when the transformation is counterclockwise rotation by 90 degrees. The destination of tile 220 is the location of tile 222, the destination of tile 222 is the location of tile 224, the destination of tile 224 is the location of tile 226, and the destination of tile 226 is the location of tile 220.

A group may have one, two or four members, depending on the transformation. Mirroring transformations form groups of two for most tiles, and groups of one member for any tiles lying on the mirror axis. Rotation by 180 degrees also forms groups of two for most tiles, except for a possible tile on the axis of rotation that belongs to its own group. Rotation by 90 degrees, as in FIG. 9, forms groups of four tiles, such as tiles 220, 222, 224 and 226, except for a possible single tile group on the axis of rotation.

Destinations of tiles are determined by a processor using a set of formulae. If tile columns are numbered from 1 to W and tile rows are numbered from 1 to h, and each tile is identified by a column x and a row y, then if (Xo,Yo) is the initial location of a tile, the final destination (X,Y) for each transformation is as follows:

$(X,Y)=(Xo, (h+1)-Yo)$ for mirror along the X-axis,
$(X,Y)=((w+1)-Xo,Yo)$ for mirror along the y-axis,
$(X,Y)=((w+1)-Xo, (h+1)-Yo)$ for 180 degree rotation,
$(X,Y)=(Yo,Xo)$ for mirror along the major diagonal,
$(X,Y)=((h+1)-Yo,Xo)$ for clockwise 90 degree rotation,
$(X,Y)=(Yo, (w+1)-Xo)$ for counterclockwise 90 degree rotation, and
$(X,Y)=((h+1)-Yo, (w+1)-Xo)$ for mirror along the minor diagonal.

In order to determine members of a group, an untransformed tile is selected as a first member of the group. For example, tile 220 is selected. The destination of this tile is determined, and the tile whose location is at that destination is another member of the group. For example, by counterclockwise rotation the destination of tile 220 is the location of tile 222, so tile 222 is a member of the group. This last step is continued with the new member until a destination has a tile which is already a member of the group. For example, tile 222's destination is the location of tile 224, tile 224 goes to tile 226's location. Tile 226's destination is the location of tile 220 which is already a member of the group, thereby ending the process. The resulting group has as members tiles 220, 222, 224 and 226.

After a group of tiles is identified, the group of tiles is transformed using image prism 218 as previously described. A first member of the group is transferred from its location in bitmap memory to temporary storage memory matrix 228. The tile whose destination is the previous location of the first group member is transferred to image prism 218, as in the discussion of FIGS. 6-8, and then to its destination. The process is repeated for the other group members, always transferring to a location that has just been vacated, until the final member has been transferred. Finally, the first member is transformed and transferred to its destination.

For example, tile 220 is first transferred to temporary storage memory 228 (step 1). Tile 226 is then transferred to image prism 218 (step 2) and then to the prior location of tile 220 (step 3), in the process being rotated counterclockwise by 90 degrees. Tile 224 is transferred to image prism 218 (step 4) and then to the prior location of tile 226 (step 5), being transformed in the process. Tile 222 is transferred to image prism 218 (step 6) and then to the prior location of tile 224 (step 7), being transformed in the process. Finally, tile 220 which is stored in temporary storage memory 228 is transferred to image prism 218 (step 8) and then to its destination at the prior location of tile 222 (step 9). Tile 220 is transformed by image prism 218 in the process.

In the preferred case where temporary storage memory 228 is another image prism, step 1 transfers tile 220 to image prism 228, step 8 is skipped, and step 9 transfers tile 220 in image prism 228 to the prior location of tile 222. Tile 220 is transformed by image prism, 228 in the process.

This group having been determined and transformed, the process is repeated with every other group until every tile is transformed.

I claim:

1. A system for performing orthogonal image transformations on bitmap images stored in a bitmap memory, said system being adapted to implement said transformations in the absence of additional storage for the image, said system also being adapted to perform any such orthogonal transformation in one pass over the data, such system comprising, a bitmap memory having a first array of memory cells for storing an image capable of being decomposed into a plurality of tiles, said tiles corresponding to blocks of memory, said bitmap memory having a data input, a data output and being word addressable, an image prism having a data input connected to the data output of said bitmap memory and a data output connected to the data input of said bitmap memory, said image prism being an array of memory cells selectively accessible by row and column such that data from column or row data-in lines are latched into a selected column or row of memory cells, and data already in a column or row of memory cells are output to column or row data-out lines, said array or memory cells having a size accommodating one of the tiles of said image, said image prism having means for performing a plurality of orthogonal transformations on said tile, temporary storage means for storing a tile of said image, said storage means having a data input connected to the data output of said bitmap memory, and a data output connected to the data input of said bitmap memory, and control means for directing a sequence of orthogonal transformations on said plurality of tiles by directing the flow of data between said bitmap memory, said image prism, and said temporary storage.

2. The system of claim 1 wherein said temporary storage means is row and column accessible.

3. The system of claim 1 wherein said temporary storage means is only row accessible.

4. The system of claim 1 wherein said temporary storage means is part of said bitmap memory.

5. The system of claim 1 wherein said image prism further comprises, a plurality of row data-in lines, each row data-in line being disposed for carrying data to a designated memory cell in any row of said image prism, a plurality of column data-in lines, each column data-in line being disposed for carrying data to a designated memory cell in any column of said image prism, a plurality of row data-out lines, each row data-out line being disposed for carrying data from a designated memory cell in any row of said image prism, a plurality of column data-out lines, each column data-out line being disposed for carrying data from a designated memory cell in any column of said image prism, a plurality of row select lines connected to said control means and disposed for selecting the row of memory cells that communicates with said row data-in lines and said row data-out lines, and a plurality of column select lines connected to said control means and disposed for selecting the column of memory cells that communicates with said column data in-lines and said column data-out lines.

6. The system of claim 5 wherein said plurality of row data-in lines are connected to a data input of said image prism, said plurality of column data-out lines are connected to a data output of said image prism, each of said plurality of column data-in lines is connected to one of said row data-in lines at one of a plurality of nodes, each of said plurality of column data-out lines is connected to one of said row data-out lines at one of said plurality of nodes, said array of memory cells of said image prism having a major diagonal and a minor diagonal, said plurality of nodes being disposed along one of said diagonals.

7. The system of claim 6 wherein said diagonal is the minor diagonal of said memory cells.

8. The system of claim 6 wherein said diagonal is the major diagonal of said memory cells.

9. The system of claim 8 wherein said data input of said image prism is connected to said data output of said bitmap memory so that the order of data bits in a word are reversed upon entry to said image prism.

10. The system of claim 8 wherein said data output of said image prism is connected to said data input of said bitmap memory so that the order of data bits in a word are reversed upon exit from said image prism.

11. The system of claim 5 wherein said plurality of column data-in lines are connected to a data input of said image prism, said plurality of row data-out lines are connected to a data output of said image prism, each of said plurality of row data-in lines is connected to one of said column data-in lines at one of a plurality of nodes, each of said plurality of row data-out lines is connected to one of said column data-out lines at one of said plurality of nodes, said array of memory cells of said image prism having a major diagonal and a minor diagonal, said plurality of nodes being disposed along one of said diagonals.

12. The system of claim 1 wherein said temporary storage means is only column accessible.

13. A system including an image prism and a bitmap memory, said image prism comprising, a data input connected to a data output of said bitmap memory composed of a plurality of tiles of equal size, said image prism also including a data output connected to the data input of the bitmap memory, sid image prism being adapted for accessing any row and column selectively within an array of memory cells such that data from column or row data-in lines are latched into a selected column or row of memory cells, and data already in a column or row of memory cells are output to column or row data-out lines, said image prism also having a size to accommodate one of said tiles, said image prism having means for performing orthogonal transformations on said tile.

14. The image prism of claim 13 wherein said means for performing orthogonal transformations comprises a plurality of nodes, each of said nodes being composed of two interconnections, one between a row and a column data-in line and a second between a row and a column data-out line, said nodes lying along a major diagonal of said array of memory cells.

15. The image prism of claim 13 wherein said means for performing orthogonal transformations comprises a plurality of nodes, each of said nodes being composed of two interconnections, one between a row and a column data-in line and a second between a row and a column data-out line, said nodes lying along a minor diagonal of said array of memory cells.

* * * * *